US008610261B2

(12) United States Patent
Oka et al.

(10) Patent No.: US 8,610,261 B2
(45) Date of Patent: Dec. 17, 2013

(54) POWER SEMICONDUCTOR DEVICE

(75) Inventors: Seiji Oka, Tokyo (JP); Yoshiko Obiraki, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 159 days.

(21) Appl. No.: 12/582,246

(22) Filed: Oct. 20, 2009

(65) Prior Publication Data
US 2010/0133681 A1 Jun. 3, 2010

(30) Foreign Application Priority Data
Nov. 28, 2008 (JP) ................................. 2008-303333

(51) Int. Cl.
H01L 23/48 (2006.01)
(52) U.S. Cl.
USPC ........... 257/693; 257/150; 257/177; 257/697; 257/698; 257/E23.169; 257/E23.125; 257/E23.068; 257/E23.18; 257/E23.182
(58) Field of Classification Search
USPC .................. 257/693, 684, 727, 712, E23.012, 257/E23.083, E23.078, E23.18, 257/E23.181–E23.188, 697, 698, 150, 177, 257/147, E23.169, E23.125, E23.068; 438/121, 122, 124, 126, 127
See application file for complete search history.

(56) References Cited

U.S. PATENT DOCUMENTS 4,750,092 A * 6/1988 Werther ........................ 361/783
5,006,922 A * 4/1991 McShane et al. ............. 257/697
6,486,548 B1 * 11/2002 Nakatsu et al. ............... 257/690
8,238,108 B2 * 8/2012 Hornkamp .................... 361/747
2005/0280490 A1 * 12/2005 Uchiyama et al. ............ 336/90
2010/0117219 A1 5/2010 Oka et al.
2010/0127371 A1 * 5/2010 Tschirbs ....................... 257/684

FOREIGN PATENT DOCUMENTS

DE    11 2008 000 229 T5    12/2009
JP            9-321216         12/1997
JP            09321216 A    * 12/1997
JP            2007-184315      7/2007

OTHER PUBLICATIONS

U.S. Appl. No. 12/564,560, filed Sep. 22, 2009, Oka, et al.
U.S. Appl. No. 13/086,499, filed Apr. 14, 2011, Oi, et al.
German Office Action issued Oct. 18. 2012, in German Patent Application No. 10 2009 055 882.9 (with English translation).

* cited by examiner

*Primary Examiner* — Ermias Woldegeorgis
(74) *Attorney, Agent, or Firm* — Oblon, Spivak, McClelland, Maier & Neustadt, L.L.P.

(57) ABSTRACT

A power semiconductor device includes a power semiconductor module having cylindrical conductors which are joined to a wiring pattern so as to be substantially perpendicular to the wiring pattern and whose openings are exposed at a surface of transfer molding resin, and an insert case having a ceiling portion and peripheral walls, the ceiling portion being provided with external terminals that are fitted into, and passed through, the ceiling portion, the external terminals having outer-surface-side connecting portions at the outer surface side of the ceiling portion and inner-surface-side connecting portions at the inner surface side of the ceiling portion. The power semiconductor module is set within the insert case such that the inner-surface-side connecting portions of the external terminals are inserted into the cylindrical conductors.

8 Claims, 9 Drawing Sheets

FIG. 2
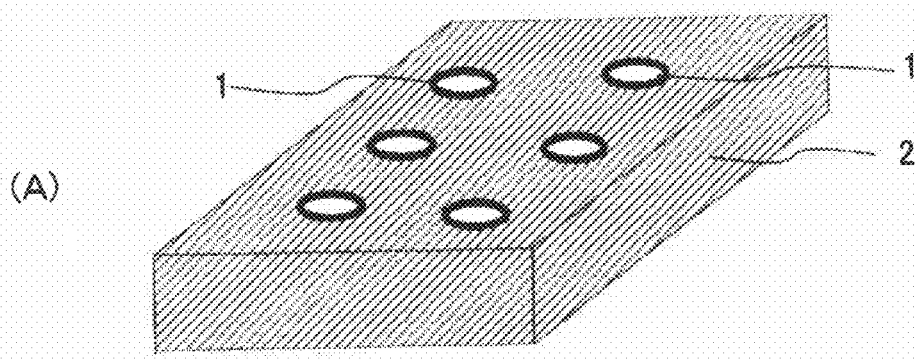
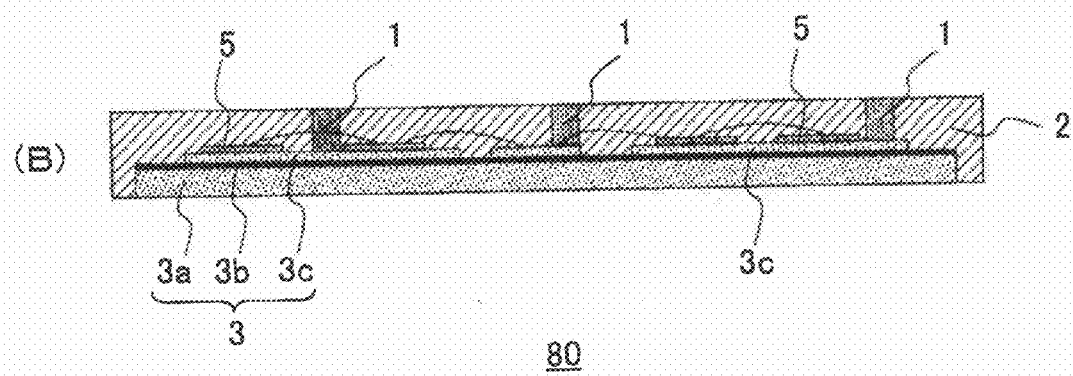

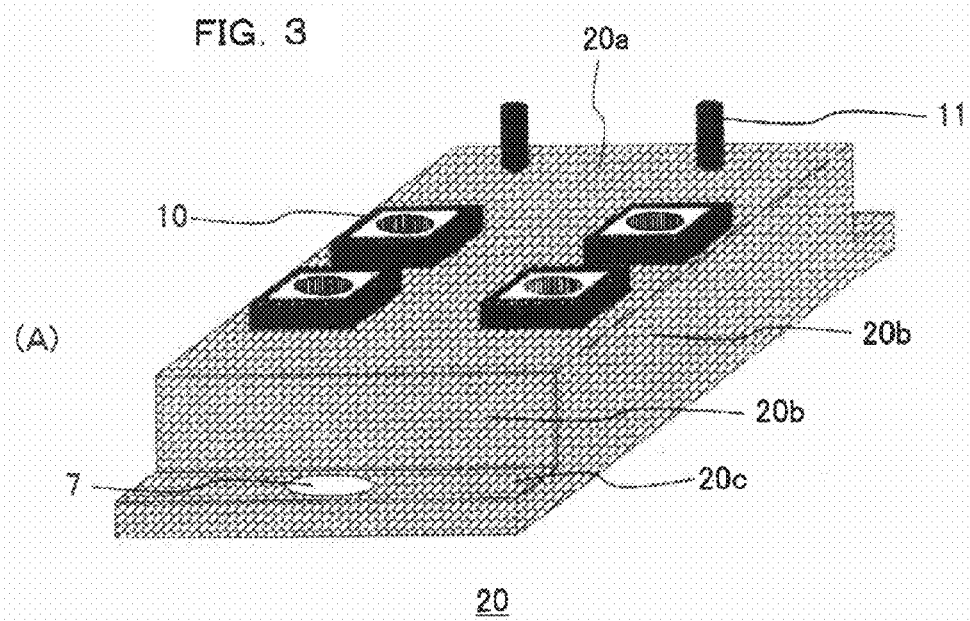
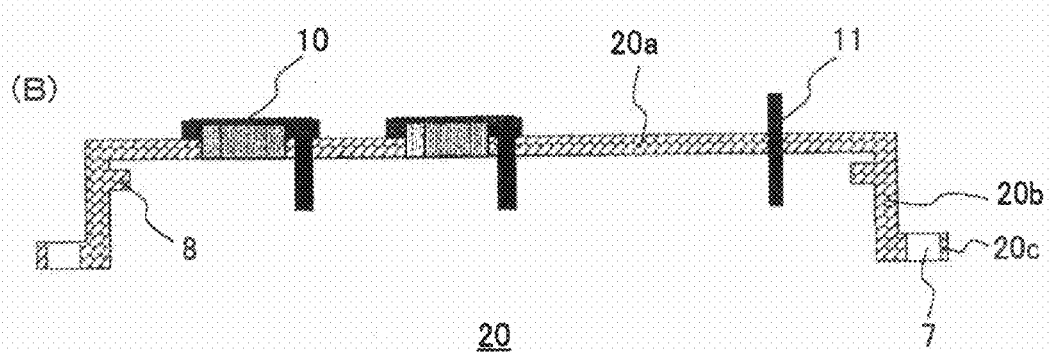

POWER SEMICONDUCTOR DEVICE

BACKGROUND OF THE INVENTION

1. Field of the Invention

The present invention relates to a power semiconductor device in which a power semiconductor module is used, and particularly to a power semiconductor device, with a reduced size, which is excellent in terms of productivity.

2. Description of the Background Art

Power semiconductor devices are required to be reduced in size and operate with a large current. One of the methods for realizing such large-current operation is to wire power semiconductor modules of the same capacity in parallel to each other, thereby realizing large-current operation.

In an existing method for reducing the size of a power semiconductor device, a power semiconductor module sealed with transfer molding resin is used. Among such power semiconductor modules sealed with transfer molding resin, a power semiconductor module that particularly realizes the size reduction is the one in which: power semiconductor elements are mounted on a circuit pattern of a circuit substrate; terminals for connecting to external wiring are joined to the circuit pattern so as to be substantially perpendicular to a surface of the circuit pattern; and the terminals are exposed at a surface of the transfer molding resin.

A copper block, a cylinder having a screw hole, and a nut fixed by resin molding, are each used for a terminal of the power semiconductor module. The terminal that is a copper block is connected to the external wiring by soldering. The terminal that is a cylinder having a screw hole, or the terminal in which a nut is fixed by resin molding, is connected to the external wiring by a bolt (see, e.g., Page 7 and 8, FIGS. 2 and 3 of Japanese Laid-Open Patent Publication No. 2007-184315 (hereinafter, referred to as Patent Document 1)).

In the case where such power semiconductor modules as described in Patent Document 1 are wired in parallel in order to realize large-current operation, wiring components between the power semiconductor modules are connected by soldering or bolts. For this reason, it is necessary to perform connection of the wiring components for each power semiconductor module sequentially. Also, in each power semiconductor module, connection of a wiring component needs to be performed for each one of the multiple terminals provided therein.

Thus, since the connection is performed for each power semiconductor module and for each of the multiple terminals, the number of wiring components for the connections is large, and connection processes are complex and the number of connection processes is large. This results in low productivity of the power semiconductor device, causing a high cost. Further, space is necessary between the power semiconductor modules in order to perform an operation of connecting the wiring components. This results in having a wide space between the power semiconductor modules, causing a problem that the power semiconductor device becomes large-sized.

SUMMARY OF THE INVENTION

The present invention has been made to solve the above problems. The object of the present invention is to provide a power semiconductor device, with improved productivity and reduced cost owing to the reduced size and simplified wiring thereof, which uses power semiconductor modules sealed with resin by transfer molding.

A power semiconductor device according to the present invention includes a power semiconductor module sealed with transfer molding resin, and an insert case for setting the power semiconductor module therein. The power semiconductor module includes power semiconductor elements mounted on a wiring pattern of a circuit substrate and cylindrical conductors, having openings, joined to the wiring pattern so as to be substantially perpendicular to the wiring pattern, the openings being exposed at a surface of the transfer molding resin. The insert case includes a ceiling portion and peripheral walls a portion which faces the ceiling portion, and external terminals which are fitted into, and passed through, the ceiling portion and which have outer-surface-side connecting portions at an outer surface side of the ceiling portion and inner-surface-side connecting portions at an inner surface side of the ceiling portion. The power semiconductor module is set within the insert case, such that the inner-surface-side connecting portions of the external terminal are inserted into the cylindrical conductors. Since the power semiconductor device according to the present invention has the above configuration, the power semiconductor device is reduced in size, and the wiring thereof is simplified.

The foregoing and other objects, features, aspects and advantages of the present invention will become more apparent from the following detailed description when read in conjunction with the accompanying drawings.

BRIEF DESCRIPTION OF THE DRAWING

FIG. 2A is a schematic perspective view showing a power semiconductor module for use in the power semiconductor device according to the first embodiment of the present invention;

FIG. 2B is a schematic cross-sectional view showing arrangement of components of the power semiconductor module of FIG. 2A;

FIG. 3A is a schematic perspective view showing an insert case used for the power semiconductor device according to the first embodiment of the present invention;

FIG. 3B is a schematic cross-sectional view of the insert case of FIG. 3A;

DETAILED DESCRIPTION OF THE PREFERRED EMBODIMENTS OF THE INVENTION

First Embodiment

Figure 1:
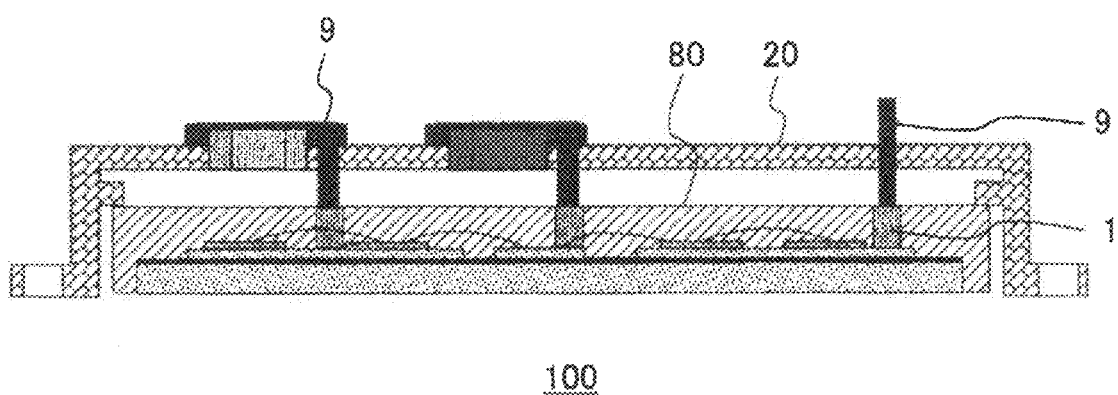
FIG. 1 is a schematic cross-sectional view showing a power semiconductor device according to the first embodiment of the present invention.

FIG. 1 is a schematic cross-sectional view showing a power semiconductor device according to the first embodiment of the present invention.

As shown in FIG. 1, in a power semiconductor device 100 of the present embodiment, a power semiconductor module 80 is set within an insert case 20. The insert case 20 is provided with external terminals 9 having portions protruding to the inside of the insert case 20. These portions are inserted and connected to cylindrical conductors 1 of the power semiconductor module 80, the cylindrical conductors 1 each having an opening at a surface of the power semiconductor module 80 (hereinafter, referred to as a top surface), the top surface facing an inner surface of the insert case 20.

FIG. 2A is a schematic perspective view showing the power semiconductor module for use in the power semiconductor device according to the first embodiment of the present invention. FIG. 2B is a schematic cross-sectional view showing arrangement of components of the power semiconductor module of FIG. 2A.

As shown in FIG. 2A, the power semiconductor module 80 used in the present embodiment is sealed with transfer molding resin 2 that is highly reliable. The opening of each cylindrical conductor 1 is exposed at the top surface of the transfer molding resin 2.

As shown in FIG. 2B, in the power semiconductor module 80 used in the present embodiment, power semiconductor elements 5 are connected, via electrically conductive adhesive such as solder, onto a metal circuit substrate 3 that is a circuit substrate in which wiring patterns 3c are formed above a metal base plate 3a while an insulation sheet 3b that is a high thermal conductive insulation layer is interposed between the metal base plate 3a and the wiring patterns 3c. In the power semiconductor module 80, wiring is formed by wire bonding. The cylindrical conductors 1 are connected to the wiring patterns 3c so as to be substantially perpendicular to a surface of the wiring patterns 3c.

The metal circuit substrate 3, the power semiconductor elements 5, the wire bonding, and the cylindrical conductors 1, are sealed with the transfer molding resin 2. However, a surface of the metal base plate 3a, which is the opposite surface to a surface having the wiring pattern 3c formed thereon, and the opening of each cylindrical conductor 1, are exposed from the transfer molding resin 2.

In the present embodiment, the metal circuit substrate 3 is used as a circuit substrate. However, a ceramic circuit substrate may be used instead of the metal circuit substrate. Alternatively, a substrate formed by joining a ceramic circuit substrate and a metal base plate via soldering may be used.

FIG. 3A is a schematic perspective view showing the insert case used for the power semiconductor device according to the first embodiment of the present invention. FIG. 3B is a schematic cross-sectional view of the insert case of FIG. 3A.

As shown in FIGS. 3A and 3B, in the case where the power semiconductor module 80 is set within the insert case 20 used in the present embodiment, the insert case 20 has a portion 20a (hereinafter, referred to as a ceiling portion 20a) facing the top surface of the power semiconductor module 80, and has peripheral walls 20b surrounding peripheral side portions of the power semiconductor module 80. The opposite side, of the insert case 20, to the ceiling portion 20a is open. A pair of peripheral walls 20b facing each other have flange portions 20c provided at the open side of the insert case 20. The flange portions 20c each have a through hole 7 formed therein. The through holes 7 are used for fixing the power semiconductor module 80 to a cooling fin (not shown).

A rib 8 is formed on the inner surface of each peripheral wall 20b of the insert case 20.

The ceiling portion 20a of the insert case 20 is provided with two types of external terminals. External terminals of one of these two types are first external terminals 10 each having a connecting portion exposed at the outer surface side of the ceiling portion 20a (hereinafter, referred to as an outer-surface-side connecting portion), which outer-surface-side connecting portion has a screw structure, and having a connecting portion protruding to the inner surface side of the ceiling portion 20a (hereinafter, referred to as an inner-surface-side connecting portion), which inner-surface-side connecting portion has a press fit structure. External terminals of the other type are second external terminals 11 each having, at the outer surface side of the ceiling portion 20a, an outer-surface-side connecting portion that has a rod structure, and having, at the inner surface side of the ceiling portion 20a, an inner-surface-side connecting portion that has a press fit structure. A nut embedded in the ceiling portion 20a of the insert case 20 is used for the connecting portion, having the screw structure, of each first external terminal 10. The size of the nut is properly determined based on the current carrying capacity.

In the present embodiment, the insert case 20 is formed by resin injection molding, and the first and second external terminals 10 and 11 are provided, at one time, in the ceiling portion 20a of the insert case 20. It is preferred that PPS (polyphenylene sulfide), PBT (polybutylene terephthalate) or the like that is thermoplastic resin is used for the insert case 20. However, any resin material that is usable for resin injection molding can be used.

The through holes 7, for fixing the cooling fin, of each flange portion 20c of the insert case 20 are provided in a position where a pressure applied from the cooling fin to the power semiconductor module 80 is greatest. The through hole 7 may be a bare hole of thermoplastic resin. However, it is desirable that a metal cylinder is inserted into the holes so that a greater clamping strength can be obtained.

Figure 4:
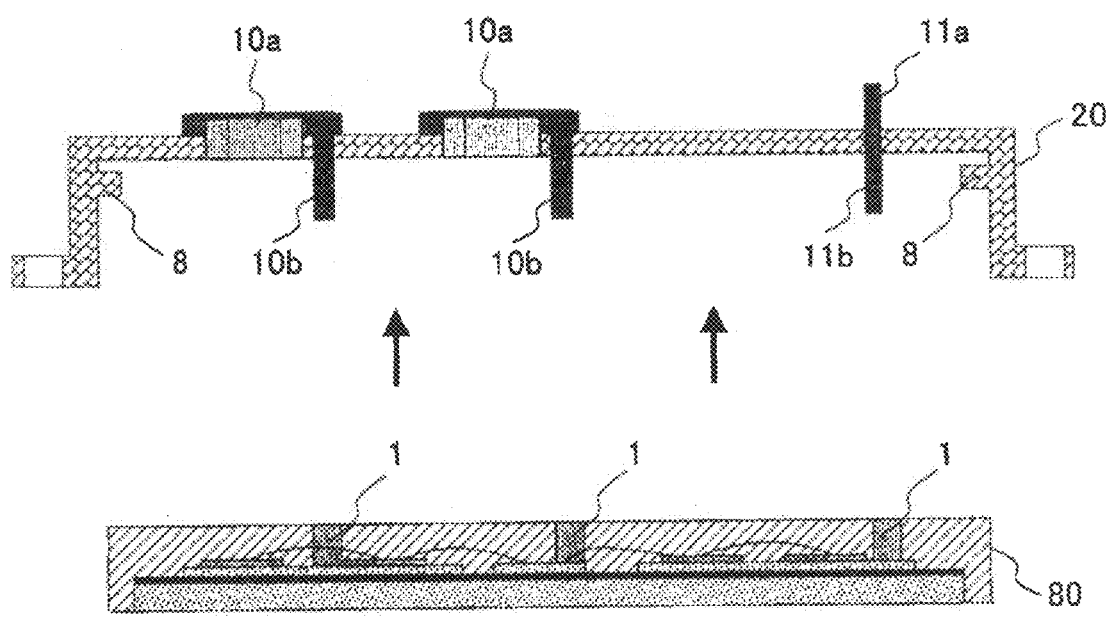
FIG. 4 illustrates that the power semiconductor module is set into the insert case of the power semiconductor device of the first embodiment of the present invention.

FIG. 4 illustrates that the power semiconductor module is set into the insert case of the power semiconductor device of the first embodiment of the present invention.

When the power semiconductor module 80 is set into the insert case 20 as shown in FIG. 4, press fit structure portions 10b that are the inner-surface-side connecting portions of the first external terminals 10, and press fit structure portions 11b that are the inner-surface-side connecting portions of the second external terminals 11, are inserted and connected to the cylindrical conductors 1 of the power semiconductor module 80. Accordingly, screw structure portions 10a that are the outer-surface-side connecting portions of the first external terminals 10, and rod structure portions 11a that are the outer-surface-side connecting portions of the second external terminals 11, become conductive with predetermined circuits of the power semiconductor module 80. In this manner, the power semiconductor device 100 is formed.

In the present embodiment, the first external terminals 10 are used for high current output, and the second external terminals 11 are used for gate signals and emitter signals of the power semiconductor module.

In the power semiconductor device 100 of the present embodiment, the screw structure portions 10a of the first external terminals 10 and the rod structure portions 11a of the second external terminals 11, which are both positioned at the outer surface side of the ceiling portion of the insert case 20, are portions conductive with the respective circuits of the power semiconductor module 80.

Therefore, the power semiconductor device 100 can be readily attached to, e.g., a conductive portion of a bus bar substrate or to a plate-shaped metal conductor; the number of wiring processes in the case where a plurality of power semiconductor devices 100 are used for the purpose of capacity increase, can be kept small; the power semiconductor device 100 is excellent in terms of productivity; and a distance between the power semiconductor devices can be reduced, which realizes size reduction. Further, the wiring between the plurality of power semiconductor devices can be formed via the conductive portion, the plate-shaped metal conductor, or the like. As a result, the number of wiring components can be reduced, which realizes reduction in cost.

In the power semiconductor device 100 of the present embodiment, the ribs 8 are provided within the insert case 20. Accordingly, a depth, to which the press fit structure portions 10b and 11b of the first and second external terminals are inserted into the cylindrical conductors 1 of the power semiconductor module 80, can be fixed. Therefore, the external terminals can be precisely fixed, and connection reliability of the external terminals is improved.

Further, in the power semiconductor device 100 of the present embodiment, since the external terminals of the insert case 20 are connected to the cylindrical conductors 1 of the power semiconductor module 80 by press-in connection, connection reliability thereof measured in a vibration test or the like is higher than in the case of solder connection. Also, there is an advantage that multiple connections can be formed at one time. Moreover, the power semiconductor module 80 can be readily removed, and thus the power semiconductor device 100 is excellent in terms of repairability.

Second Embodiment

Figure 5:
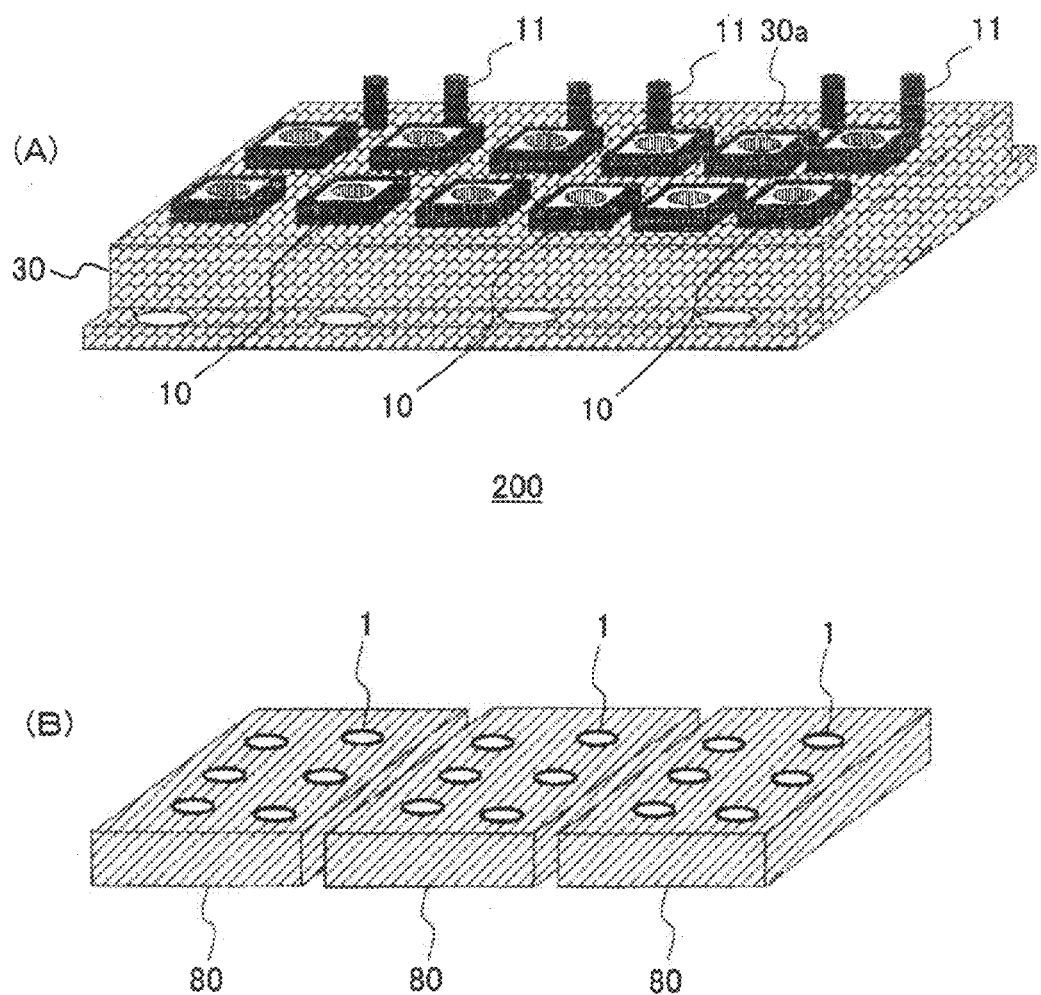
FIG. 5A is a schematic perspective view showing a power semiconductor device according to the second embodiment of the present invention.
FIG. 5B is a schematic perspective view showing power semiconductor modules for use in the power semiconductor device of FIG. 5A.

FIG. 5A is a schematic perspective view showing a power semiconductor device according to the second embodiment of the present invention. FIG. 5B is a schematic perspective view showing power semiconductor modules for use in the power semiconductor device of FIG. 5A.

A power semiconductor device 200 of the present embodiment is a result of setting three power semiconductor modules 80 shown in FIG. 5B into a single insert case 30.

To be specific, although the insert case 30 used for the power semiconductor device 200 of the present embodiment is of the same type as the insert case of the first embodiment, the size of the insert case 30 allows the three power semiconductor modules 80 to be set therein at the same time. A ceiling portion 30a of the insert case 30 is provided with external terminals for the three power semiconductor modules 80. These external terminals are inserted and connected to the cylindrical conductors 1 provided in the power semiconductor modules 80. The external terminals used in the present embodiment are the first external terminals 10 and the second external terminals 11 that are the same as those used in the first embodiment.

Since the power semiconductor device 200 of the present embodiment has the above configuration, the power semiconductor device 200 provides the same effects as those of the power semiconductor device 100 of the first embodiment. In addition, a plurality of power semiconductor modules can be arranged in a closer proximity to each other, and thus the power semiconductor device can be further reduced in size.

In the present embodiment, the number of power semiconductor modules is three. However, any number of power semiconductor modules may be set if physically possible.

Further, in the present embodiment, power semiconductor modules to be set are the power semiconductor modules 80 as shown in FIG. 2. However, the power semiconductor modules to be set are not limited thereto.

Third Embodiment

Figure 6:
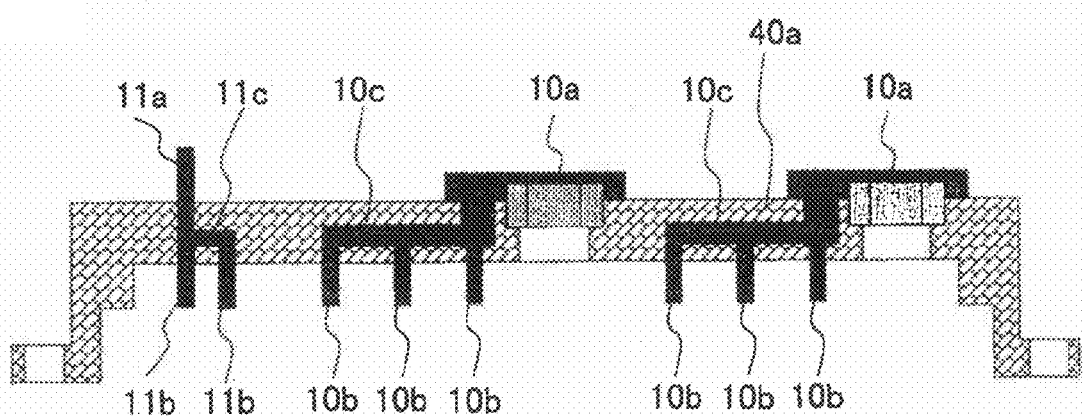
FIG. 6 is a schematic cross-sectional view showing an insert case used for a power semiconductor device according to the third embodiment of the present invention.

FIG. 6 is a schematic cross-sectional view showing an insert case used for a power semiconductor device according to the third embodiment of the present invention.

As shown in FIG. 6, the first external terminals 10 of an insert case 40 of the power semiconductor device of the present embodiment are each provided with a plurality of press fit structure portions 10b that are inner-surface-side connecting portions. The screw structure portion 10a, of each first external terminal 10, which is an outer-surface-side connecting portion, and the plurality of press fit structure portions 10b that are the inner-surface-side connecting portions, are connected by internal wiring 10c that is provided so as to be embedded in a ceiling portion 40a of the insert case 40.

Also, the second external terminal 11 is provided with a plurality of press fit structure portions 11b that are inner-surface-side connecting portions. The rod structure portion 11a that is an outer-surface-side connecting portion, and the plurality of press fit structure portions 11b that are inner-surface-side connecting portions, are connected by internal wiring 11c that is provided so as to be embedded in the ceiling portion 40a of the insert case 40. A copper-type material having excellent electrical conductivity is used for the internal wirings 10c and 11c.

In the present embodiment, the internal wirings 10c and 11c are embedded in the ceiling portion of the insert case 40. Alternatively, the internal wirings 10c and 11c may be provided so as to contact the inner surface of the ceiling portion 40a of the insert case 40.

Also in the present embodiment, a power semiconductor module is set into the insert case 40, and the press fit structure portions 10b that are the inner-surface-side connecting portions of the first external terminals 10, and the press fit structure portions 11b that are the inner-surface-side connecting portions of the second external terminal 11, are inserted and connected to the cylindrical conductors of the power semiconductor module (not shown), accordingly. In this manner, the power semiconductor device is formed.

In the power semiconductor device of the present embodiment, each first external terminal 10 of the insert case 40 is a result of connecting, by the internal wiring 10c, the press fit structure portions 10b that are a plurality of inner-surface-side connecting portions, to the screw structure portion 10a that is a single outer-surface-side connecting portion. Also, the second external terminal 11 is a result of connecting, by the internal wiring 11c, the press fit structure portions 11b that are a plurality of inner-surface-side connecting portions, to the rod structure portion 11a that is a single outer-surface-side connecting portion. Therefore, on the outside of the insert case 40, external wiring between the first external terminals, and external wiring between the second external terminal, are no longer necessary.

Consequently, the power semiconductor device of the present embodiment provides the same effects as those of the power semiconductor device of the first embodiment. In addition, the power semiconductor device can be further reduced in size, and the manufacturing process of the power semiconductor device can be simplified.

Also in the present embodiment, a plurality of power semiconductor modules may be set within the single insert case.

Fourth Embodiment

Figure 7:
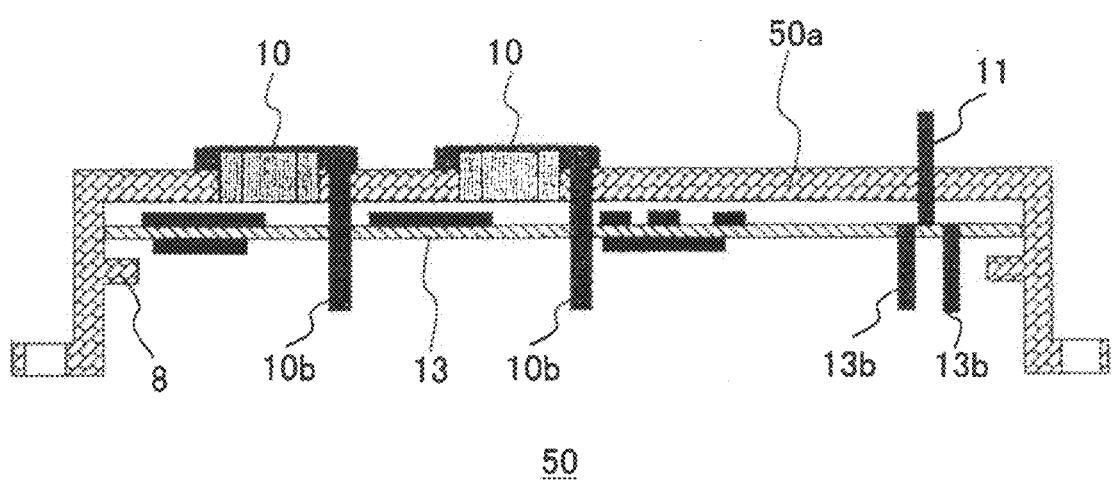
FIG. 7 is a schematic cross-sectional view of an insert case used for a power semiconductor device according to the fourth embodiment of the present invention.

FIG. 7 is a schematic cross-sectional view of an insert case used for a power semiconductor device according to the fourth embodiment of the present invention.

As shown in FIG. 7, a control printed circuit board 13 is provided within an insert case 50 of the power semiconductor device of the present embodiment.

The control printed circuit board 13 is provided between a ceiling portion 50*a* and portions, of the insert case 50, at which the ribs 8 are formed. Accordingly, this does not cause inconvenience for setting of a power semiconductor module.

Further, a plurality of printed circuit board terminals 13*b* each having a press fit structure are provided on a surface of the control printed circuit board 13, the surface facing the power semiconductor module. These printed circuit board terminals 13*b* are electrically connected to each other via wiring within the printed circuit board, and electrically connected to the inner-surface-side connecting portion of the second external terminal 11 provided in the ceiling portion 50*a* of the insert case 50. Further, the press fit structure portions 10*b* of the first external terminals 10 penetrate through the control printed circuit board 13.

The control printed circuit board 13 is set either in a method where the control printed circuit board 13 is set into a mold at the time of molding the insert case and the control printed circuit board 13 is integrated into the insert case during the molding, or in a method where the control printed circuit board 13 is fitted to the inside of the insert case having been molded. In terms of cost, it is more advantageous to employ the method where the control printed circuit board 13 is fitted to the inside of the insert case having been molded. In the case where the control printed circuit board 13 is fitted to the inside of the insert case having been molded, the control printed circuit board 13 is, after being fitted to the inside of the molded insert case, connected to the second external terminal 11 by soldering or the like.

Also in the present embodiment, a power semiconductor module is set into the insert case 50; and the press fit structure portions 10*b* that are the inner-surface-side connecting portions of the first external terminals 10, and the printed circuit board terminals 13*b*, of the control printed circuit board 13, each of which has a press fit structure, are inserted and connected to the cylindrical conductors of the power semiconductor module (not shown), accordingly. In this manner, the power semiconductor device is formed.

In the power semiconductor device of the present embodiment, the control printed circuit board 13 is provided within the insert case 50, and the plurality of printed circuit board terminals 13*b* provided on the control printed circuit board 13 are electrically connected to the second external terminal 11. Therefore, at the outside of the insert case 50, external wiring is no longer necessary.

Accordingly, the power semiconductor device of the present embodiment provides the same effects as those of the power semiconductor device of the first embodiment. In addition, the power semiconductor device can be further reduced in size, and the manufacturing process of the power semiconductor device can be simplified.

Also in the present embodiment, a plurality of power semiconductor modules may be set within the single insert case.

Fifth Embodiment

Figure 8:
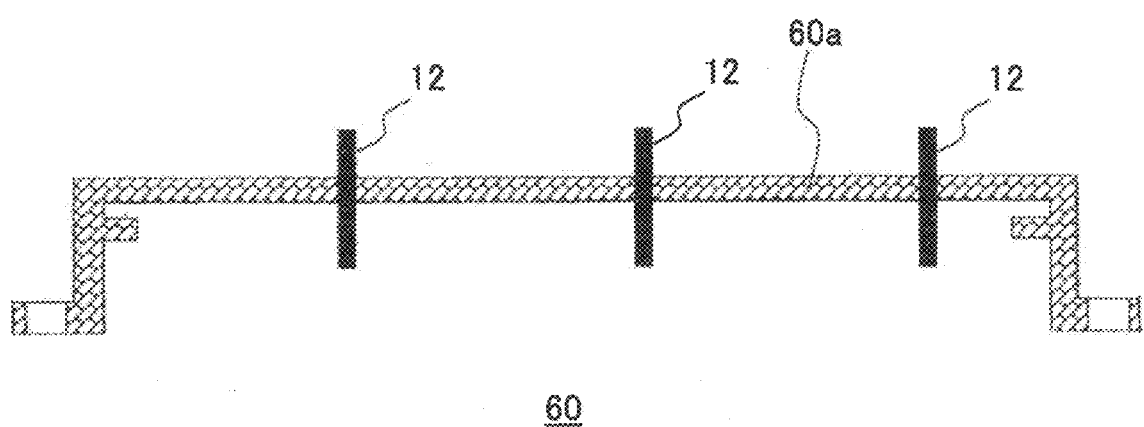
FIG. 8 is a schematic cross-sectional view of an insert case used for a power semiconductor device according to the fifth embodiment of the present invention.
Figure 9:
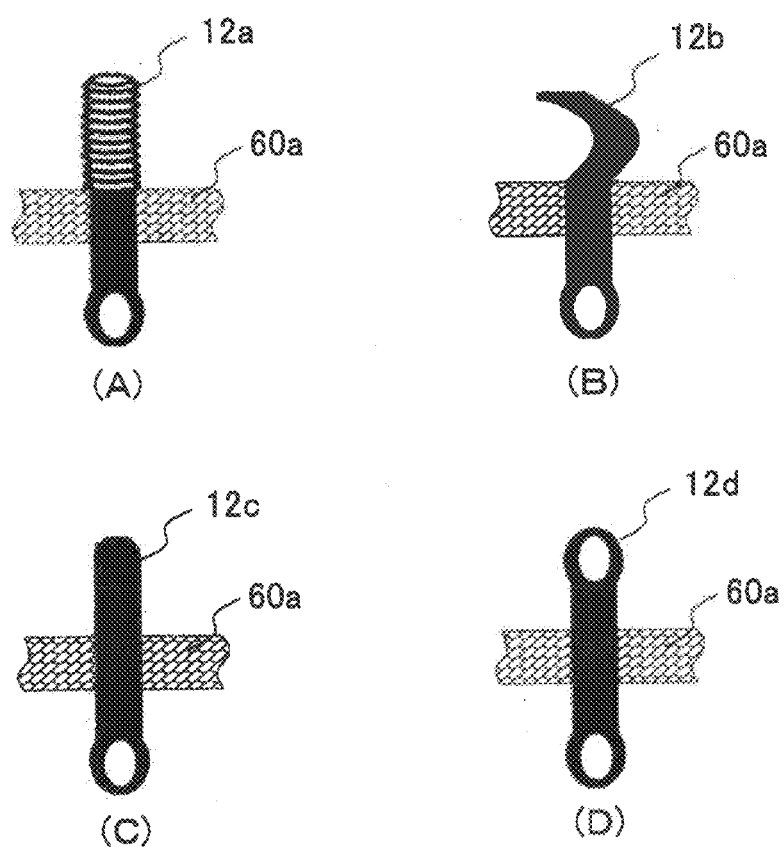
FIG. 9A shows a third external terminal for use in the power semiconductor device according to the fifth embodiment of the present invention.
FIG. 9B shows a fourth external terminal for use in the power semiconductor device according to the fifth embodiment of the present invention.
FIG. 9C shows a fifth external terminal for use in the power semiconductor device according to the fifth embodiment of the present invention.
FIG. 9D shows a sixth external terminal for use in the power semiconductor device according to the fifth embodiment of the present invention.

FIG. 8 is a schematic cross-sectional view of an insert case used for a power semiconductor device according to the fifth embodiment of the present invention.

As shown in FIG. 8, all the external terminals 12 of an insert case 60 of the power semiconductor device of the present embodiment each have, at the outer surface side of a ceiling portion 60*a*, an outer-surface-side connecting portion having a rod structure, and have, at the inner surface side of the ceiling portion 60*a*, an inner-surface-side connecting portion having a press fit structure.

FIGS. 9A to 9D are schematic diagrams showing a third external terminal, a fourth external terminal, a fifth external terminal, and a sixth external terminal, for use in the power semiconductor device according to the fifth embodiment of the present invention.

Each external terminal 12 for use in the power semiconductor device of the present embodiment is, as shown in FIGS. 9A to 9D, any one of: a third external terminal 12*a*, of which the outer-surface-side connecting portion at the outer surface side of the ceiling portion 60*a* of the insert case has a coil spring structure; a fourth external terminal 12*b*, of which the outer-surface-side connecting portion has a plate spring structure; a fifth external terminal 12*c*, of which the outer-surface-side connecting portion has a structure for solder connection; and a sixth external terminal 12*d*, of which the outer-surface-side connecting portion has a press fit structure.

In the present embodiment, the inner-surface-side connecting portions of all the external terminals 12*a*, 12*b*, 12*c* and 12*d* have press fit structures. The press fit structure is, for example, a compliant pin structure or a star pin structure.

The external terminals used in the present embodiment are required to be excellent in terms of electrical conductivity and strength, and have spring resiliency. Therefore, it is preferred that copper alloy is used for the external terminals.

Also in the present embodiment, a power semiconductor module is set into the insert case 60, and the press fit structure portions of the external terminals 12, which are inner-surface-side connecting portions, are inserted and connected to the cylindrical conductors of the power semiconductor module (not shown), accordingly. In this manner, the power semiconductor device is formed.

In the present embodiment, which type of external terminals among from the third to sixth external terminals 12*a* to 12*d* are used in the power semiconductor device, is determined based on the structure of connecting portions, of external wiring, to which the external terminals are connected.

Further, in the present embodiment, a printed circuit board (not shown) is used as the external wiring to be connected to the external terminals. For example, in the case where the external terminals are pressed against, and joined to, pad portions of the printed circuit board, the third external terminals 12*a* or the fourth external terminals 12*b* are used. Also, in the case where the external terminals are joined, by soldering, to through holes of the printed circuit board, the fifth external terminals 12*c* are used. Further, in the case where the external terminals are connected to the through holes of the printed circuit board by press-in connection, the sixth external terminals 12d are used.

Accordingly, the power semiconductor device using the third external terminals 12a or the fourth external terminals 12b allows the printed circuit board, which is to be connected to the power semiconductor device, to be reduced in size. Whereas, the power semiconductor device using the fifth external terminals 12c or the sixth external terminals 12d allows the printed circuit board, which is to be connected to the power semiconductor device, to have a large current carrying capacity.

Thus, the power semiconductor device of the present embodiment provides the same effects as those of the power semiconductor device of the first embodiment. In addition, the power semiconductor device can be further reduced in size, and the manufacturing process thereof can be simplified. Moreover, the power semiconductor device of the present embodiment can be electrically connected to external wiring of various different shapes, which provides excellent convenience.

Also in the present embodiment, a plurality of power semiconductor modules may be set within the single insert case.

In the power semiconductor device according to the present invention, the external terminals provided at the insert case are inserted into the cylindrical conductors of the power semiconductor module, whereby the power semiconductor device is connected to external wiring. Thus, the present invention can be effectively applied to a power semiconductor device that is required to have a large capacity.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor device comprising:
a power semiconductor module sealed with transfer molding resin; and
an insert case for setting the power semiconductor module to a cooling fin, wherein the power semiconductor module includes:
power semiconductor elements mounted on a wiring pattern of a circuit substrate; and
cylindrical conductors, having openings, joined to the wiring pattern so as to be substantially perpendicular to the wiring pattern, the openings being exposed at a surface of the transfer molding resin and configured to face an inner surface side of a ceiling portion of the insert case,
wherein the insert case includes:
the ceiling portion and peripheral walls; and
a plurality of external terminals embedded in the ceiling portion such that the plurality of external terminals penetrate through the ceiling portion;
outer-surface-side connecting portions of the plurality of external terminals for connecting the power semiconductor device with an external wiring being formed so as to protrude at a top surface side of the ceiling portion, inner-surface-side connecting portions of the plurality of external terminals for connecting with the cylindrical conductors exposing at the surface of the transfer molding resin being formed so as to protrude at the inner surface side of the ceiling portion, and the inner-surface-side connecting portions having the same length;
the ends of the inner-surface-side connecting portions of the external terminals having press fit structures;
the insert case is configured to be pressed toward the power semiconductor module, whereby each of the inner-surface-side connecting portions of the plurality of external terminals embedded in the ceiling portion is connected into the respective cylindrical conductors formed in the power semiconductor module sealed with the transfer molding resin all together by press-fitting, and the insert case is connected with the power semiconductor module.

2. The power semiconductor device according to claim 1, wherein
a control printed circuit board is provided within the insert case,
the inner-surface-side connecting portions of the external terminals are connected to a surface of the control printed circuit board, the surface facing the ceiling portion of the insert case,
a plurality of printed circuit board terminals are formed on a surface of the control printed circuit board, which surface is opposite to the surface facing the ceiling portion of the insert case,
the inner-surface-side connecting portion and the plurality of printed circuit board terminals are connected to each other via wiring of the control printed circuit board, and
the plurality of printed circuit board terminals are inserted into the cylindrical conductors.

3. The power semiconductor device according to claim 1, wherein a plurality of the power semiconductor modules are set within the insert case.

4. The power semiconductor device according to claim 1, wherein the outer-surface-side connecting portions of the external terminals have screw structures.

5. The power semiconductor device according to claim 1, wherein the outer-surface-side connecting portions of the external terminals have spring structures.

6. The power semiconductor device according to claim 1, wherein the outer-surface-side connecting portions of the external terminals have press fit structures.

7. The power semiconductor device according to claim 1, wherein an inner surface of each peripheral wall of the insert case is provided with a rib.

8. The power semiconductor device according to claim 1, wherein
a flange portion is formed, on an outer surface of at least one of the peripheral walls, at an open side of the insert case, and
the flange portion is provided with through holes.

* * * * *